United States Patent [19]

Mehrotra et al.

[11] Patent Number: 5,838,582
[45] Date of Patent: Nov. 17, 1998

[54] METHOD AND SYSTEM FOR PERFORMING PARASITIC CAPACITANCE ESTIMATIONS ON INTERCONNECT DATA WITHIN AN INTEGRATED CIRCUIT

[75] Inventors: Sharad Mehrotra, Austin; Paul Gerard Villarrubia, Round Rock, both of Tex.

[73] Assignee: International Business Machines Corporation, Armonk, N.Y.

[21] Appl. No.: 726,720

[22] Filed: Oct. 7, 1996

[51] Int. Cl.[6] .................................................. G06F 17/50
[52] U.S. Cl. .............................................. 364/490; 364/491
[58] Field of Search ................................... 364/488, 489, 364/490, 491, 578

[56] References Cited

U.S. PATENT DOCUMENTS

| | | | |
|---|---|---|---|
| 4,694,403 | 9/1987 | Nomura | 364/488 |
| 5,010,493 | 4/1991 | Matsumoto et al. | 364/490 |
| 5,197,015 | 3/1993 | Hartoog et al. | 364/490 |
| 5,243,547 | 9/1993 | Tsai et al. | 364/578 |
| 5,322,438 | 6/1994 | McNutt et al. | 437/51 |
| 5,367,469 | 11/1994 | Hartoog | 364/491 |
| 5,379,232 | 1/1995 | Komoda | 364/489 |
| 5,452,224 | 9/1995 | Smith, Jr. et al. | 364/488 |
| 5,471,409 | 11/1995 | Tani | 364/578 |
| 5,502,644 | 3/1996 | Hamilton et al. | 364/488 |
| 5,504,037 | 4/1996 | Iwamatsu | 437/187 |
| 5,610,833 | 3/1997 | Chang et al. | 364/491 |
| 5,629,860 | 5/1997 | Jones et al. | 364/490 |
| 5,706,206 | 1/1998 | Hammer et al. | 364/489 |

*Primary Examiner*—Kevin J. Teska
*Assistant Examiner*—Leigh Marie Garbowski
*Attorney, Agent, or Firm*—Anthony V. S. England; Antony P. Ng; Andrew J. Dillon

[57] ABSTRACT

A method and system for providing parasitic capacitance estimation on interconnect data for an integrated circuit is disclosed. An integrated circuit typically includes a substrate layer and several metal layers. In accordance with the method and system of the present invention, a center wire within one of the several metal layers is first identified. Then, a first capacitance value between a first wire and the center wire as well as a second capacitance value between a second wire and the center wire are determined. The first wire, the second wire, and the center wire are in the same metal layer. Next, a third capacitance value between a third wire and the center wire is determined. This third wire is in a metal layer located directly beneath the center wire. Finally, a fourth capacitance value between a fourth wire and the center wire is determined. The fourth wire is in a metal layer located directly above the center wire. If there are more than one wire within the metal layer directly above the center wire, the fourth capacitance value is distributed among all these wires. By so doing, the total parasitic capacitance for the center wire can be estimated by utilizing the first capacitance value, the second capacitance value, the third capacitance value, and the fourth capacitance value or the distributed fourth capacitance values.

13 Claims, 7 Drawing Sheets

METHOD AND SYSTEM FOR PERFORMING PARASITIC CAPACITANCE ESTIMATIONS ON INTERCONNECT DATA WITHIN AN INTEGRATED CIRCUIT

CROSS-REFERENCE TO A RELATED APPLICATION

The present invention is related to the subject matter of a co-pending United States Patent Application entitled "Method and System for Characterizing Interconnect Data Within an Integrated Circuit for Facilitating Capacitance Estimation," Ser. No. 08/726,722 filed Oct. 7, 1996, and assigned to the assignee herein named. The content of the above-mentioned co-pending United States Patent Application is incorporated by reference herein.

BACKGROUND OF THE INVENTION

1. Technical Field

The present invention relates to a method and system for data processing in general and, in particular, to a method and system for performing capacitance estimation. Still more particularly, the present invention relates to a method and system for performing parasitic capacitance estimation on interconnect data within an integrated circuit.

2. Description of the Prior Art

During the course of designing a very large-scale integrated (VLSI) circuit, it is desirable to render some form of circuit characterization in order to determine the performance of the circuit. The characteristic of a VLSI circuit is generally dependent upon two major factors, namely, parasitic capacitance and parasitic resistance. Needless to say, parasitic capacitances associated with interconnect materials within a VLSI circuit can result in unacceptable circuit performances. Hence, it is very important to calculate all parasitic capacitances within a VLSI circuit in order to determine whether or not they exceed certain design criteria before actual fabrication of the circuit.

In the past, several techniques have been employed for estimating parasitic capacitances within a VLSI circuit layout. The simplest one is a per-unit-length model of the total wire capacitance, according to certain assumptions about the neighborhood of a wire conductor. Such model is based upon a linear equation in terms of wire area and wire perimeter, as follows:

$$C_s = k_a * A + k_p * P \quad (1)$$

where A is a wire area, P is a wire perimeter, $k_a$ is an area coefficient and $k_p$ is based on statistical assumptions about the environment of a wire. Per-unit-length models have a good accuracy on the average, and is useful for early design analysis when complete circuit layout information is typically not available. Otherwise, per-unit-length models can be quite inaccurate in most other cases and should not be employed for final timing verification. Furthermore, per-unit-length models cannot provide coupling capacitances between wire conductors, and hence, a signal integrity analysis cannot be performed.

A so-called 2-D capacitance calculation method computes capacitance based only on a layer overlap. This can also be thought of as a purely two-body computation. Unfortunately, mutual capacitances between two wire conductors depend heavily upon the proximity of other wire conductors also. Hence, the 2-D capacitance calculation method can be grossly inaccurate when it is utilized to compute all coupling capacitances in a VLSI circuit layout having multi-layer metal interconnects.

A 3-D capacitance calculation method computes capacitances between all the conducting bodies present within a capacitance calculation scenario. Such a method is usually based on a boundary-element model (BEM) of the conductor surfaces or a finite-element model (FEM) analysis of the VLSI circuit layout geometry. However, the 3-D capacitance calculation method may be too precise and accurate in a sense that the requirement of large matrix inversions renders this method computationally prohibitive for most VLSI circuit layouts.

Undoubtedly, parasitic capacitance estimation is a crucial step in verifying timing and detecting signal integrity violations within a VLSI circuit design. However, given the fine geometries and small wire separations of a VLSI circuit layout, a rigorous parasitic capacitance estimation model may be too impractical to implement due to the limitations of today's computing technology. Consequently, it would be desirable to provide an improved method for performing parasitic capacitance estimation on interconnect data within a VLSI circuit such that parasitic capacitance information can be obtained efficiently.

SUMMARY OF THE INVENTION

In view of the foregoing, it is therefore an object of the present invention to provide an improved method and system for data processing.

It is another object of the present invention to provide an improved method and system for performing capacitance estimation.

It is yet another object of the present invention to provide an improved method and system for performing parasitic capacitance estimation on interconnect data within an integrated circuit.

An integrated circuit typically includes a substrate layer and several metal layers. In accordance with the method and system of the present invention, a center wire within one of the several metal layers is first identified. Then, a first capacitance value between a first wire and the center wire, as well as a second capacitance value between a second wire and the center wire is determined. The first wire, the second wire, and the center wire are in the same metal layer. Next, a third capacitance value between a third wire and the center wire is determined. This third wire is in a metal layer located directly beneath the center wire. Finally, a fourth capacitance value between a fourth wire and the center wire is determined. The fourth wire is in a metal layer located directly above the center wire. If there is more than one wire within the metal layer directly above the center wire, the fourth capacitance value is distributed among all these wires. By so doing, the total parasitic capacitance for the center wire can be estimated by utilizing the first capacitance value, the second capacitance value, the third capacitance value, and the fourth capacitance value or the distributed fourth capacitance values.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a variety of computers under a number of different operating systems. The computer may be, for example, a workstation, a mini-computer, or a mainframe computer. In addition, the computer may be a stand-alone system or part of a network such as a local-area network (LAN) or a wide-area network (WAN).

Figure 1:
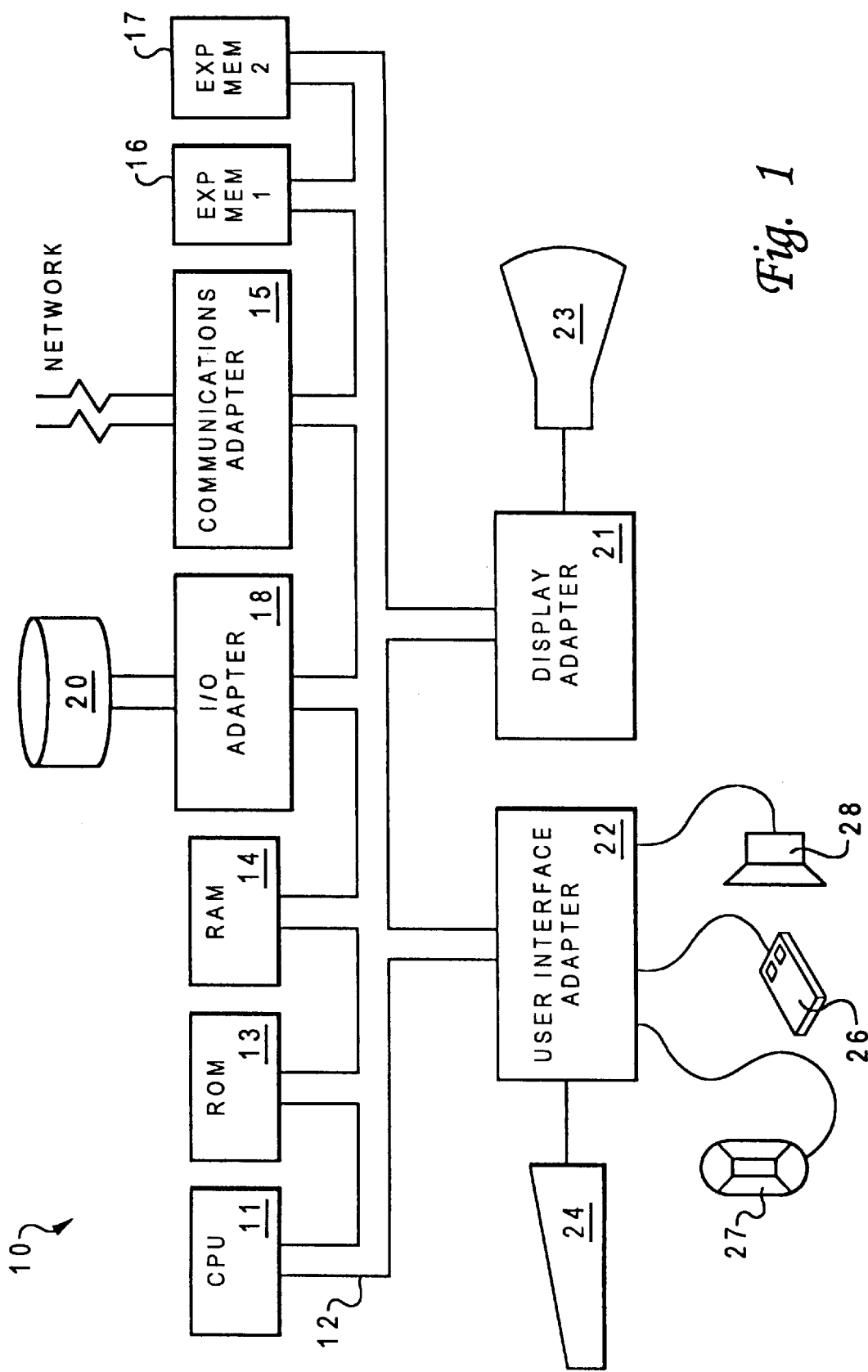
FIG. 1 is a diagram of a typical workstation that may be utilized in conjunction with a preferred embodiment of the present invention.

Referring now to the drawings and in particular to FIG. 1, there is depicted a diagram of a typical workstation 10 which may be utilized in conjunction with a preferred embodiment of the present invention. A central processing unit (CPU) 11 is interconnected to various other components via system bus 12. Read only memory (ROM) 13, connecting to CPU 11 via system bus 12, includes a basic input/output system (BIOS) software that controls certain basic functions of workstation 10. Random access memory (RAM) 14, I/O adapter 18 and communications adapter 15 are also interconnected to system bus 12. Expanded memory 16 and expanded memory 17 may be added to workstation 10, and are shown to be interconnected to system bus 12.

Generally, expanded memories 16 and 17 are adapter cards that include multiple single in-line memory modules (SIMMs) along with corresponding registers capable of being written to by an appropriate device driver. I/O adapter 18 may be a Small Computer System Interface (SCSI) adapter that communicates with a disk storage device 20. Communications adapter 15 interconnects system bus 12 with an outside network, enabling workstation 10 to communicate with other such systems. In addition, input/output devices are connected to system bus 12 via user interface adapter 22 and display adapter 21. Keyboard 24, track ball 27, mouse 26, and speaker 28 are all interconnected to system bus 12 via user interface adapter 22. Display monitor 23 is connected to system bus 12 via display adapter 21. In this manner, a user is capable of inputting to workstation 10 through keyboard 24, track ball 27, or mouse 26 while receiving output from workstation 10 via speaker 28 and display monitor 23. Additionally, an operating system such as AIX™ from International Business Machines Corporation may be utilized to coordinate the functions of the various components shown in FIG. 1.

Preferred implementations of the invention include implementations as a computer system programmed to execute the method or methods described herein, and as a computer program product. According to the computer system implementation, sets of instructions for executing the method or methods are resident in the random access memory 14 of one or more computer systems configured generally as described above. Until required by the computer system, the set of instructions may be stored as a computer program product in another computer memory, for example, in disk drive 20 (which may include a removable memory such as an optical disk or floppy disk for eventual use in the disk drive 20). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, for at least the most part, machine operations processing electrical signals to generate other electrical signals.

Figure 2:
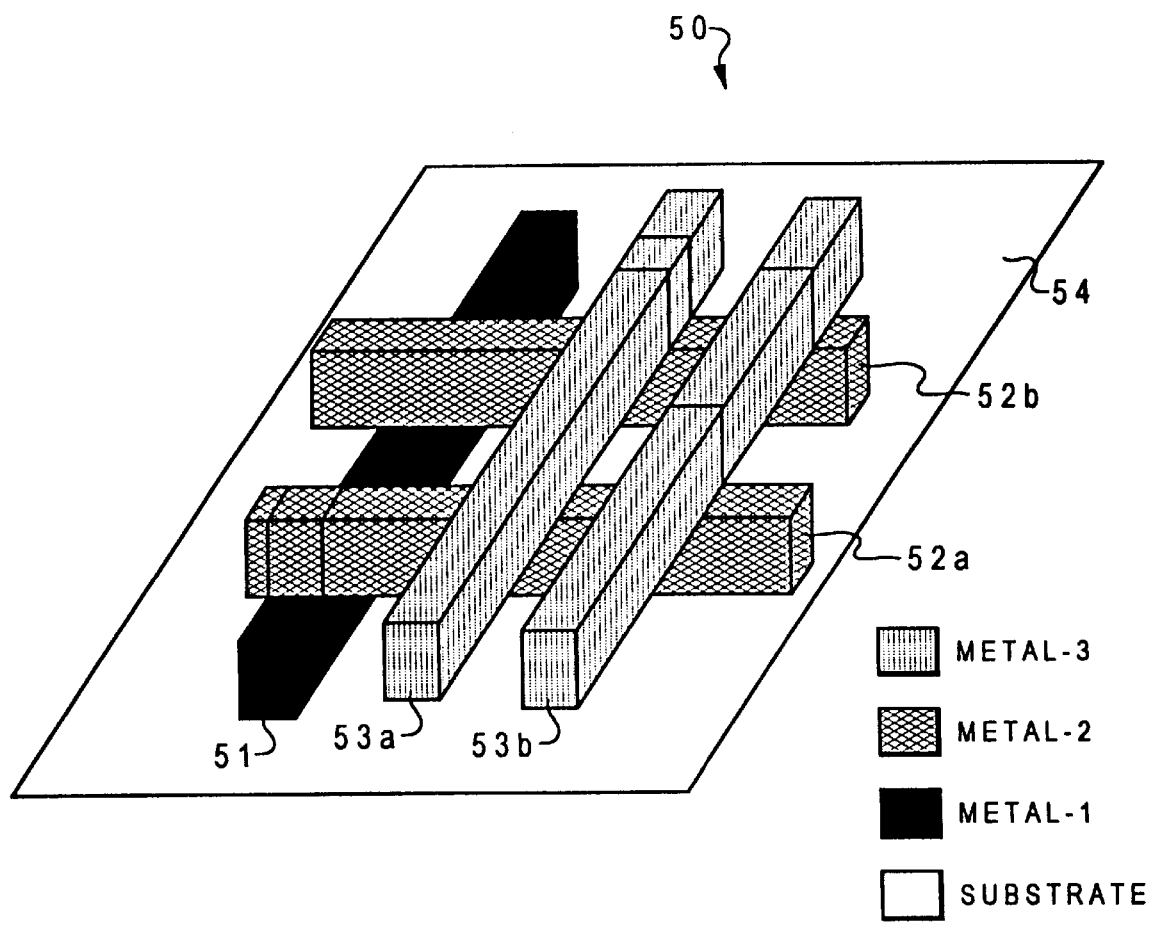
FIG. 2 is a pictorial illustration of a typical multi-layer metal interconnect geometry.

With reference now to FIG. 2, there is a pictorial illustration of a typical multi-layer metal interconnect geometry. Interconnect geometry 50, as shown, is comprised of a metal-1 layer, a metal-2 layer, a metal-3 layer, and a substrate layer, though more or fewer metal layers may be present in a typical integrated circuit. Various interconnects in each metal layer depicted in FIG. 2 are represented by a metal-1 wire 51; metal-2 wires 52a, 52b; and metal-3 wires 53a, 53b on top of a substrate 54. In addition, there is a dielectric layer (not shown) embedded between each of the above-mentioned layers.

As shown in FIG. 2, each of wires 51–53 runs primarily in one of two orthogonal directions, and each has a rectangular cross-section. The thickness of wires 51–53 is comparable to the wire-widths in current technologies. The only ground plane is substrate 54, which might be quite distant from a wire in a higher metallization level.

Computing 2-D capacitances

In accordance with a preferred embodiment of the present invention, a method for performing capacitance estimation employs a 2-D model of wire capacitance and may extend the 2-D model with heuristics to compute all 3-D capacitances, if necessary. In the 2-D model, a center wire conductor has two adjacent wire conductors at the same metal level as the center wire conductor, and two metal planes, one at a metal level above the center wire conductor while the other is at a metal level below it.

Figure 3:
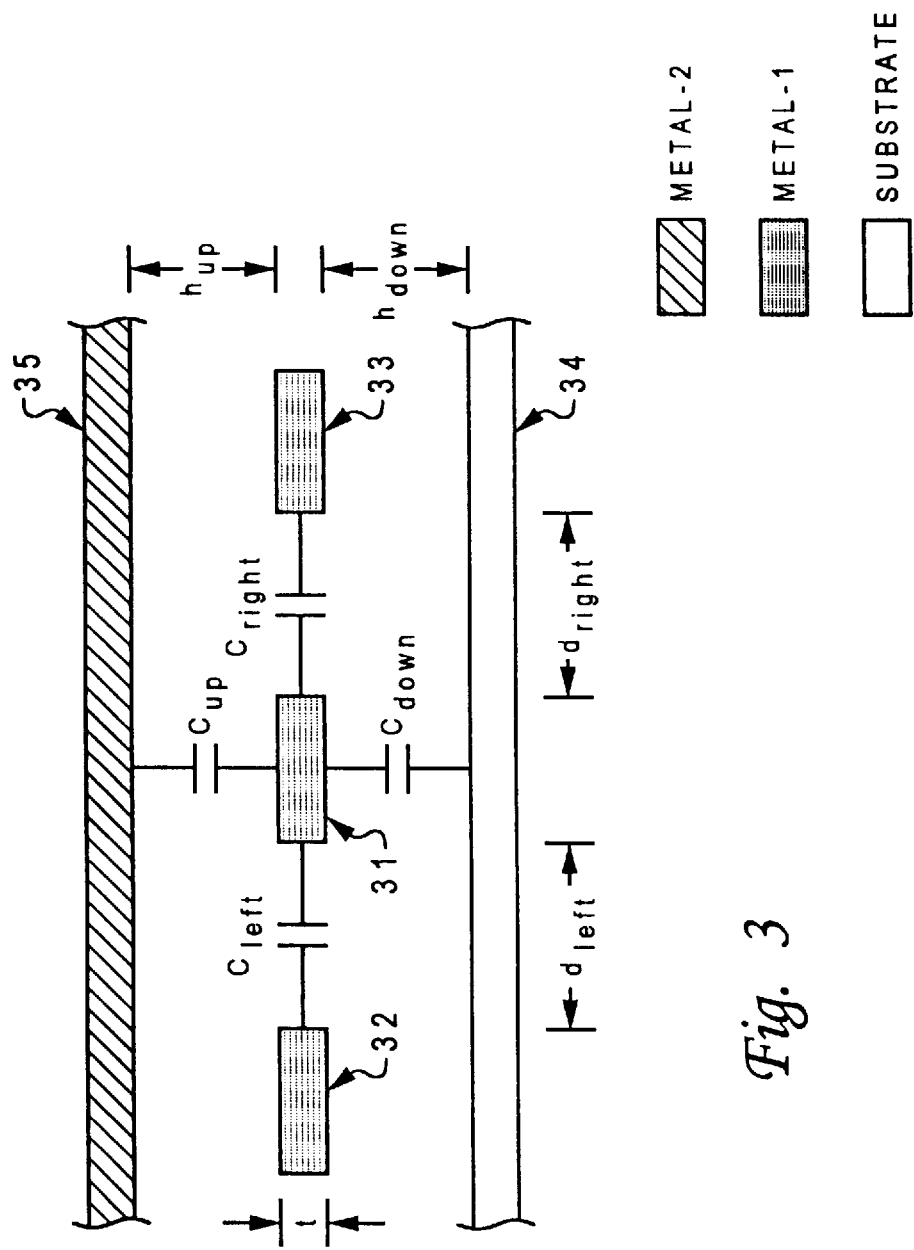
FIG. 3 is a cross-sectional diagram of a two-layer metal interconnect geometry for illustrating the 2-D model.

Referring now to FIG. 3, there is depicted a cross-sectional diagram of a two-layer metal interconnect geometry for illustrating the 2-D model. As shown, center wire conductor 31 has two neighbors, wire conductor 32 and wire conductor 33, adjacent to center wire conductor 31. All wire conductors 31–33 are within the same metal level and are infinitely long in the direction perpendicular to the paper. In addition, center wire conductor 31 has a metal plane 35 located above center wire conductor 31 and a metal plane 34 located below center wire conductor 31. Line-to-line capacitances ($C_{left}$ and $C_{right}$) and line-to-plane capacitances ($C_{up}$ and $C_{down}$) are given as a function of wire thickness (t), separation distance between wire conductors ($d_{left}$ and $d_{right}$), and separation distance to the planes above and below ($h_{up}$ and $h_{down}$). This 2-D model can be easily captured by utilizing parametric equations in the five variables, or analytically modelled, as in the Rounded Corner Hybrid Model that is well-known to those who are skilled in the relevant art.

Figure 4:
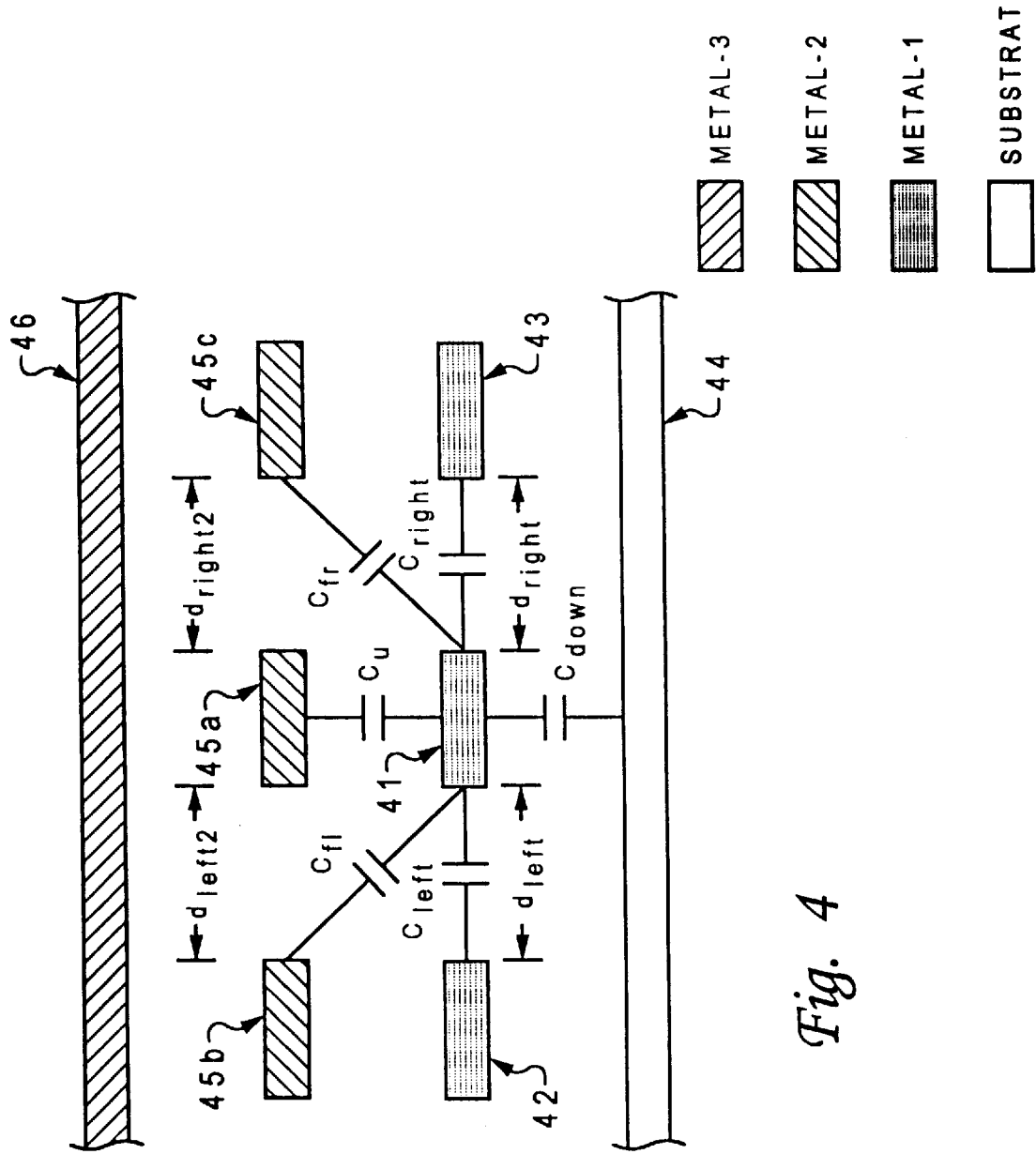
FIG. 4 is a cross-sectional diagram of a three-layer metal interconnect geometry for illustrating a horizontal partitioning.

In order to perform parasitic capacitance estimations in accordance with a preferred embodiment of the invention, two heuristics termed as "horizontal partitioning" and "vertical partitioning" are applied to the 2-D model shown above. With reference now to FIG. 4, there is depicted a cross-sectional diagram of a three-layer metal interconnect geometry for illustrating horizontal partitioning. As shown, center wire conductor 41, neighbor wire conductors 42, 43, and bottom metal plane 44 resemble the similar elements of the 2-D model in FIG. 3. However, instead of a continuous metal plane in a metal layer lying directly above center wire conductor 41, there are, for example, three separate pieces of wire conductors 45a, 45b, and 45c, as well as a metal layer 46. The three wire conductors 45a–45c are running in the direction perpendicular to the paper, similar to wire conductors 41–43.

In order to estimate the parasitic capacitance for center wire conductor 41 to each of wire conductors 45a–45c, a horizontal partitioning heuristic is applied. The horizontal partitioning employs a polynomial in $d_{left}$, $d_{right}$, $d_{left2}$, and $d_{right2}$, to partition the capacitance, $C_{up}$, computed from the 2-D model, into three separate capacitances—$C_{fl}$, $C_u$, and $C_{fr}$. This polynomial may be obtained by running several experiments in a finite element capacitance calculation tool that is well-known to those who are skilled in the art, whereby the various distances and the various capacitances are measured. The polynomial equation is fitted to these measured results. Thus, in this example, the horizontal partitioning heuristic dictates that $C_{up}$ be partitioned into $C_{fl}$, $C_u$, and $C_{fr}$ (i.e., $C_{up}=C_{fl}+C_u+C_{fr}$).

Figure 5A:
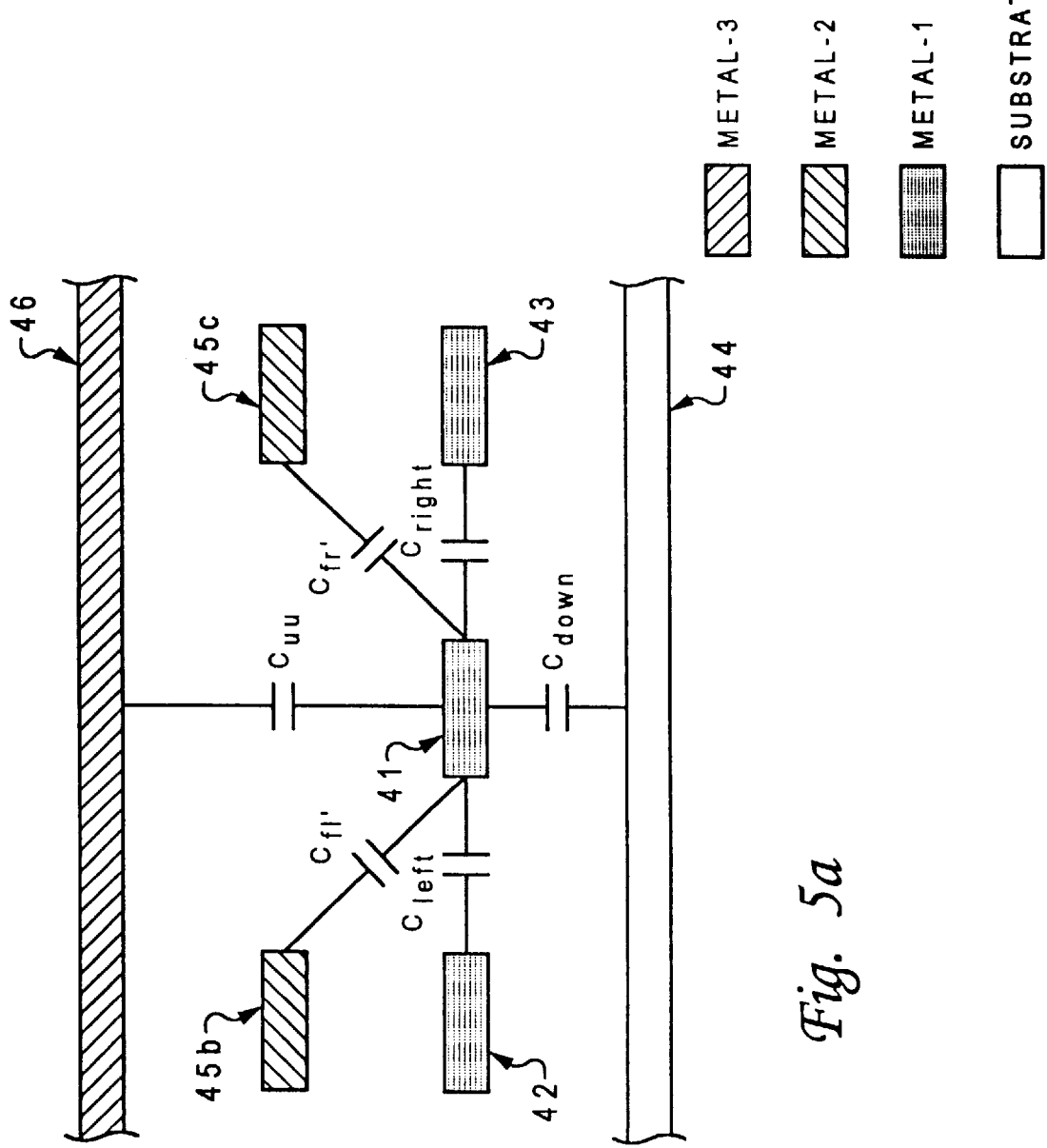
FIG. 5a is a cross-sectional diagram of a three-layer metal interconnect geometry for illustrating a vertical partitioning.

However, if there is no wire conductor present in the metal layer directly above the center metal conductor, then a vertical partitioning heuristic is applied. Referring now to FIG. 5a, there is depicted a cross-sectional diagram of a three-layer metal interconnect geometry for illustrating vertical partitioning. As shown, center wire conductor 41, neighbor wire conductors 42, 43, bottom metal plane 44, wire conductors 45b, 45c, and top metal plane 46 are the same elements as those shown in FIG. 4. However, there is no wire conductor 45a locating directly above center wire conductor 41. In this case, part of $C_u$ from FIG. 4 would be attributed to metal plane 46 in metal-3 layer directly above center wire conductor 41 as $C_{uu}$. In addition, the total parasitic capacitance of center wire conductor 41 must be smaller than that computed by utilizing the 2-D model.

Figure 5B:
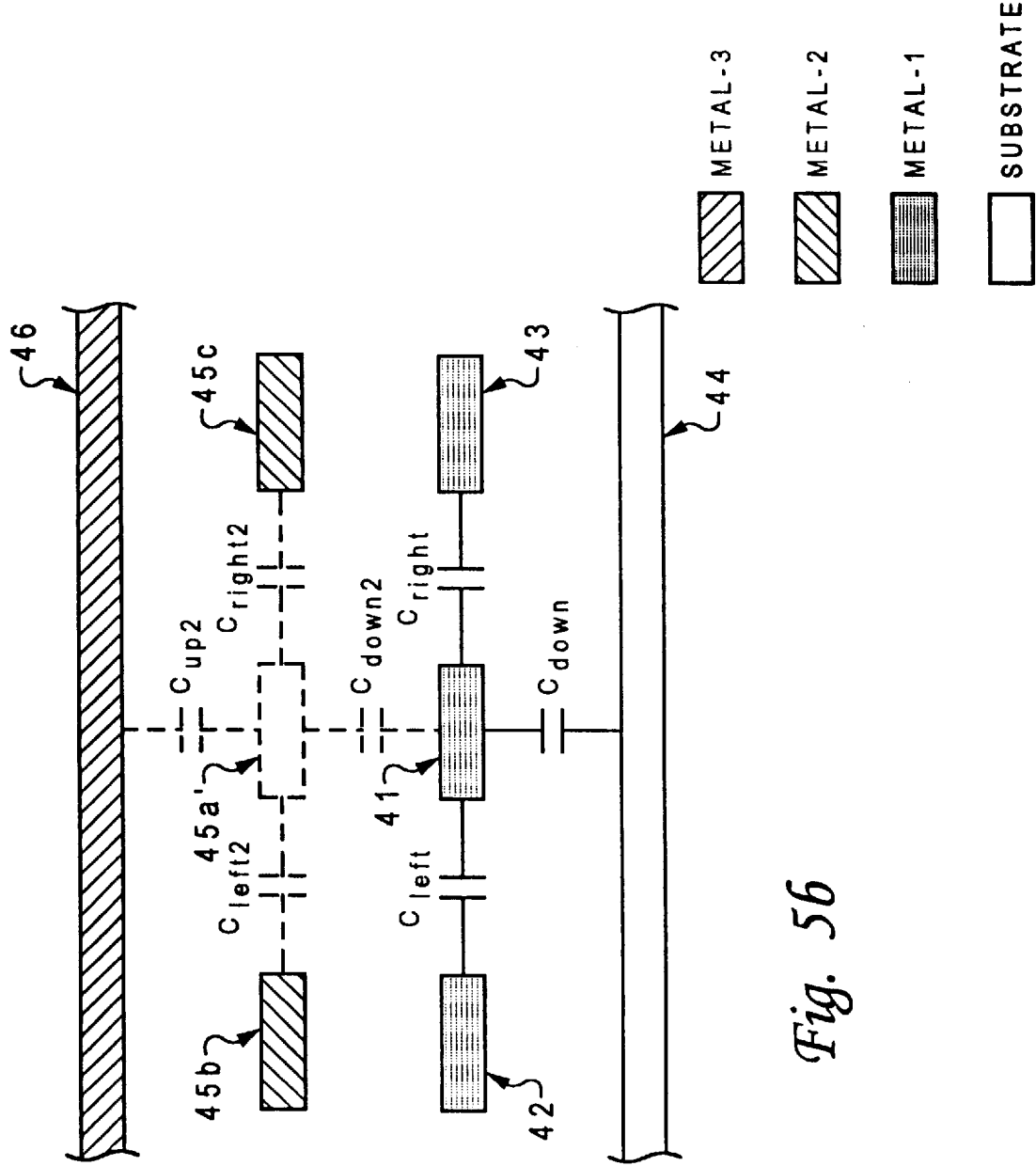
FIG. 5b is a cross-sectional diagram of a three-layer metal interconnect geometry having an imaginary center wire conductor for illustrating a vertical partitioning.

In order to calculate $C_{uu}$, an imaginary wire conductor 45a' (shown in phantom lines) is inserted between wire conductors 45b and 45c, as shown in FIG. 5b. All the parasitic capacitances for this imaginary wire conductor 45a' are subsequently computed according to the 2-D model. Now, if the parasitic capacitance from center wire conductor 41 to imaginary wire conductor 45a' is equal to $C_u$ as shown in FIG. 4, then $C_{uu}$ as shown in FIG. 5a can be determined as follows:

$$C_{uu} = \frac{C_{up2}}{C_{up2} + C_{down2} + C_{left2} + C_{right2}} * C_u \qquad (2)$$

In addition, the fringing capacitances $C_{fl'}$ and $C_{fr'}$ to wire conductors 45b, 45c in metal-2 layer shown in FIG. 5a would also be increased, as compared to the configuration shown in FIG. 4. A first-order correction to these numbers can be estimated as follows:

$$C_{fl'} = C_{fl} + \frac{C_{left2}}{C_{up2} + C_{down2} + C_{left2} + C_{right2}} * C_u \qquad (3)$$

$$C_{fr'} = C_{fr} + \frac{C_{left2}}{C_{up2} + C_{down2} + C_{left2} + C_{right2}} * C_u \qquad (4)$$

Note that the small fraction of $C_u$ that is not assigned to any wire conductor in the above equations is the fraction corresponding to $C_{down2}$. This implies that the self-capacitance of the metal-1 wire conductor is diminished by this unassigned fraction of $C_u$.

The horizontal partitioning and the vertical partitioning heuristics, in conjunction with the 2-D model, provide a way of computing all capacitances in the 2-D slice. By performing an upward pass through all the metal levels and employing the partitioning heuristics, or the 2-D model, as appropriate, all the parasitic capacitances related to a center wire conductor can be computed. It is understood by those who are skilled in the art that the vertical partitioning method as shown above may also be applied to calculate parasitic capacitances $C_{down}$ of the center wire conductor in much the same way as calculating $C_{up}$.

Computing 3D Capacitances

Figure 6:
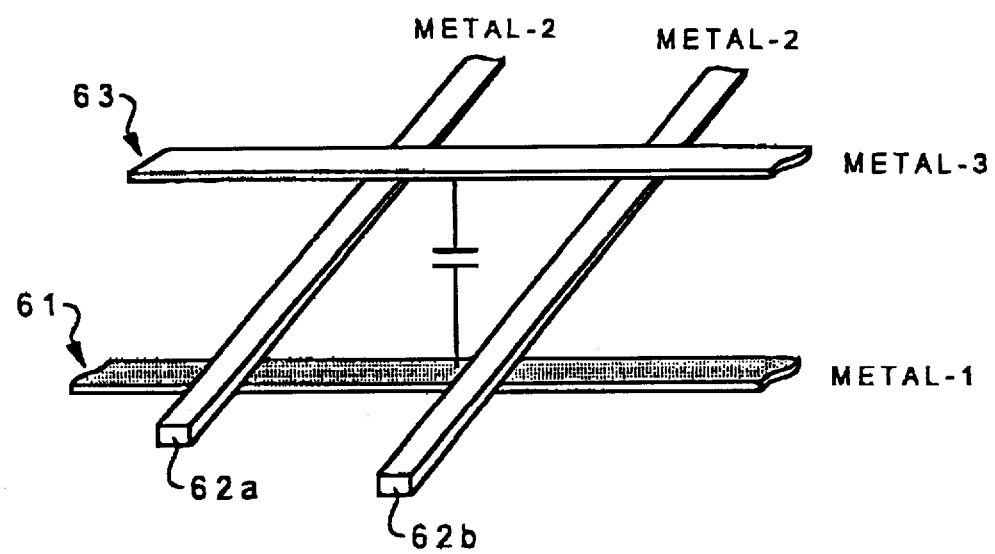
FIG. 6 is an isometric view of a three-layer metal interconnect geometry for illustrating capacitance shielding.

3-D capacitance effects are those that cannot be captured utilizing a 2-D model. The 2-D model assumes that the wire conductors are infinitely long in the third dimension (i.e., pointing in or out of the paper), and all parasitic capacitances are given per-unit length. Hence, shielding effects, such as those shown in FIG. 6 cannot be captured with a 2-D model. The capacitance shielding can, however, be computed by proper application of the partitioning heuristics. Consider a portion of metal-1 wire conductor 61 that is not beneath either of metal-2 wire conductors 62a, 62b in FIG. 6. If a layer located directly above is considered to be metal-3 wire conductor 63 for this portion, then the shielding of metal-1 to metal-3 capacitance by metal-2 wire conductors 62a, 62b cannot be modeled. However, if metal-2 wire conductors 62a, 62b is considered the layer above, and then the vertical partitioning heuristic is applied to distribute the capacitance looking up ($C_{up}$) as fringing capacitance to the metal-2 wire conductors and capacitance to metal-3, then the shielding effect is properly modeled.

As has been described, the present invention provides an improved method of performing parasitic capacitance estimation on interconnect data for an integrated circuit. In this disclosure, a fast, yet accurate, parasitic capacitance computation technique that can properly account for 2-D and 3-D effects in a VLSI circuit geometries is described. This technique is scalable, i.e., it can be applied to any number of wiring layers. The only underlying assumption is that the cross-section of each wire conductor is rectangular and each wire runs in one of the two orthogonal directions. This assumption is true for most, if not all, current VLSI metallizations.

While the invention has been particularly shown and described with reference to a preferred embodiment, it will be understood by those skilled in the art that various changes in form and detail may be made therein without departing from the spirit and scope of the invention.

What is claimed is:

1. A method of performing parasitic capacitance estimation on interconnect data for an integrated circuit, wherein said integrated circuit includes a substrate layer and a plurality of metal layers, said method comprising the steps of:

identifying a center wire within one of said plurality of metal layers;

determining a first capacitance value between a first wire and said center wire, wherein said first wire and said center wire are in the same metal layer of said plurality of metal layers;

determining a second capacitance value between a second wire and said center wire, wherein said second wire and said center wire are in the same metal layer of said plurality of metal layers;

determining a third capacitance value between a third wire and said center wire, wherein said third wire is in a metal layer directly beneath said center wire;

determining a fourth capacitance value between a fourth wire and said center wire, wherein said fourth wire is in a metal layer directly above said center wire;

distributing said fourth capacitance value among a plurality of wires if there is more than one wire within said metal layer directly above said center wire; and estimating a total parasitic capacitance for said center wire based on said first capacitance value, said second capacitance value, said third capacitance value, and said fourth capacitance value or said distributed fourth capacitance values.

2. The method of performing parasitic capacitance estimation on interconnect data within an integrated circuit according to claim 1, wherein said step of distributing further includes a step of distributing said fourth capacitance value according to a horizontal distance from each of said plurality of wires to said center wire.

3. The method of performing parasitic capacitance estimation on interconnect data within an integrated circuit according to claim 1, wherein said method further includes a step of distributing said fourth capacitance value according to a contributing function of any fringing wire and an imaginary fourth wire if said fourth wire is not present.

4. The method of performing parasitic capacitance estimation on interconnect data within an integrated circuit according to claim 1, wherein said first wire is adjacent to the left of said center wire while said second wire is adjacent to the right of said center wire.

5. The method of performing parasitic capacitance estimation on interconnect data within an integrated circuit according to claim 1, wherein said third wire is directly beneath said center wire while said fourth wire is directly above said center wire.

6. A computer system for performing parasitic capacitance estimation on interconnect data for an integrated circuit, wherein said integrated circuit includes a substrate layer and a plurality of metal layers, said computer system comprising:

means for identifying a center wire within one of said plurality of metal layers;

means for determining a first capacitance value between a first wire and said center wire, wherein said first wire and said center wire are in the same metal layer of said plurality of metal layers;

means for determining a second capacitance value between a second wire and said center wire, wherein said second wire and said center wire are in the same metal layer of said plurality of metal layers;

means for determining a third capacitance value between a third wire and said center wire, wherein said third wire is in a metal layer directly beneath said center wire;

means for determining a fourth capacitance value between a fourth wire and said center wire, wherein said fourth wire is in a metal layer directly above said center wire;

means for distributing said fourth capacitance value among a plurality of wires if there is more than one wire within said metal layer directly above said center wire; and means for estimating a total parasitic capacitance for said center wire based on said first capacitance value, said second capacitance value, said third capacitance value and said fourth capacitance value or said distributed fourth capacitance values.

7. The computer system for performing parasitic capacitance estimation on interconnect data for an integrated circuit according to claim 6, wherein said means for distributing further includes a means for distributing said fourth capacitance value according to a horizontal distance from each of said plurality of wires to said center wire.

8. The computer system for performing parasitic capacitance estimation on interconnect data for an integrated circuit according to claim 6, wherein said computer system further includes a means for distributing said fourth capacitance value according to a contributing function of any fringing wire and an imaginary fourth wire if said fourth wire is not present.

9. The computer system for performing parasitic capacitance estimation on interconnect data for an integrated circuit according to claim 6, wherein said first wire is adjacent to the left of said center wire while said second wire is adjacent to the right of said center wire.

10. The computer system for performing parasitic capacitance estimation on interconnect data for an integrated circuit according to claim 6, wherein said third wire is directly beneath said center wire while said fourth wire is directly above said center wire.

11. A computer program product for performing parasitic capacitance estimation on interconnect data for an integrated circuit, wherein said integrated circuit includes a substrate layer and a plurality of metal layers, said computer program product comprising:

program code means for identifying a center wire within one of said plurality of metal layers;

program code means for determining a first capacitance value between a first wire and said center wire, wherein said first wire and said center wire are in the same metal layer of said plurality of metal layers;

program code means for determining a second capacitance value between a second wire and said center wire, wherein said second wire and said center wire are in the same metal layer of said plurality of metal layers;

program code means for determining a third capacitance value between a third wire and said center wire, wherein said third wire is in a metal layer directly beneath said center wire;

program code means for determining a fourth capacitance value between a fourth wire and said center wire, wherein said fourth wire is in a metal layer directly above said center wire;

program code means for distributing said fourth capacitance value among a plurality of wires if there is more than one wire within said metal layer directly above said center wire; and program code means for estimating a total parasitic capacitance for said center wire based on said first capacitance value, said second capacitance value, said third capacitance value and said fourth capacitance value or said distributed fourth capacitance values.

12. The computer program product for performing parasitic capacitance estimation on interconnect data for an integrated circuit according to claim 11, wherein said program code means for distributing further includes a program code means for distributing said fourth capacitance value according to a horizontal distance from each of said plurality of wires to said center wire.

13. The computer program product for performing parasitic capacitance estimation on interconnect data for an integrated circuit according to claim 11, wherein said computer program product further includes a program code means for distributing said fourth capacitance value according to a contributing function of any fringing wire and an imaginary fourth wire if said fourth wire is not present.

\* \* \* \* \*